United States Patent [19]

Cote et al.

[11] Patent Number: 5,216,277
[45] Date of Patent: Jun. 1, 1993

[54] LEAD FRAMES WITH LOCATION EYE POINT MARKINGS

[75] Inventors: James M. Cote; Jurgen M. Ekberg, both of Export, Pa.

[73] Assignee: National Semiconductor Corporation, Santa Clara, Calif.

[21] Appl. No.: 785,816

[22] Filed: Oct. 31, 1991

[51] Int. Cl.[5] .................. H01L 23/48; H01L 23/54
[52] U.S. Cl. ................................. 257/666; 257/677
[58] Field of Search ..................... 357/70, 68, 80; 437/217, 220; 257/666, 677

[56] References Cited

U.S. PATENT DOCUMENTS

| | | | |
|---|---|---|---|
| 3,838,274 | 8/1974 | Doubek, Jr. et al. | 250/201 |
| 4,012,766 | 3/1977 | Phillips et al. | 357/70 |
| 4,209,830 | 6/1980 | Arimura et al. | 364/490 |
| 4,214,364 | 7/1980 | St. Louis et al. | 29/827 |
| 4,513,355 | 4/1985 | Shroeder et al. | 357/80 |
| 4,523,851 | 6/1985 | Maheras et al. | 356/399 |
| 4,525,597 | 6/1985 | Abe | 74/52.4 |
| 4,768,883 | 9/1988 | Waldo et al. | 356/399 |
| 4,855,928 | 8/1989 | Yamanaka | 364/489 |
| 4,927,491 | 5/1990 | Masaki | 456/630 |
| 4,984,731 | 1/1991 | Imamura | 228/102 |

FOREIGN PATENT DOCUMENTS 5237768 9/1975 Japan.
1-264232 1/1990 Japan.

Primary Examiner—Rolf Hille
Assistant Examiner—S. V. Clark
Attorney, Agent, or Firm—Daniel Patch

[57] ABSTRACT

The disclosure relates to providing locating eye point markings on two selected terminals of a cer-dip lead frame The eye point markings take the form of physical indentations on the outer ends of the terminals outside their coined areas. The markings are of a character sufficient to allow electromagnetic wave detections.

1 Claim, 2 Drawing Sheets

LEAD FRAMES WITH LOCATION EYE POINT MARKINGS

BACKGROUND OF THE INVENTION

The present invention relates to an improvement in the use of lead frames of the type employed as a component of ceramic dual in line packages, commonly referred to as cer-dips in connection with integrated circuit technology. The invention more particularly has reference to locating eye point markings on the terminals of the lead frames.

Cer-dip lead frames to which ceramic bases of chips are secured are well known in the semiconductor field and have been used in many different forms in the past in ceramic packaging technology. The lead frames are generally made from a very thin strip of aluminum/nickel/iron alloy and formed into the lead frame shape by a series of stamping operations.

As an essential part of the wire bonding operational step in the manufacture of the packages, which step is performed automatically by a computer driven machine, it is necessary to determine the exact location of the outer end of each terminal lead of the frame in order to position the frame relative to the welding elements of the bonding machine. This is done by the bonding machine making an optical camera examination of two diametrically oppositely arranged leads and using this determination to mathematically calculate the exact locations of all of the ends of the remaining terminal leads.

Since the location of the ends of the leads is done optically, it is dependent on the ability of the viewing instrumentation to accurately and quickly detect the two opposite ends of the selected terminals Because, however, of certain more or less inherent conditions surrounding the viewing, the locating step can not be quickly and accurately performed. This is due, in part, to the fact that the various components that have been attached to the frame before the frame is advanced to the wire bonding operation, for example the ceramic base, provide a very poor background for optical camera detection of the terminals of the frame, along with the fact that the frame and particularly the terminal ends themselves create a poor backdrop for camera viewing.

BRIEF DESCRIPTION OF THE INVENTION

The present invention has for its object providing an improved lead frame, including the employment of locating eye point markings on selected terminals of the frame that will allow quick and accurate electromagnetic wave detection of the selected terminals.

Another object of the invention is to provide locating eye point markings in the form of physical indentations in the selected terminals of such a form and nature that will allow quick and accurate electromagnetic wave detection of the selected terminals.

A still further object of the invention is to place the locating eye point markings on diametrically opposite terminals between a coined portion and a support portion of the selected terminals, the area used for the marking being the nickel/iron area of the frame.

BRIEF DESCRIPTION OF THE DRAWINGS

These objects, as well as other novel features and advantages of the invention will be better understood when the following description is read along with the accompanying drawings of which.

DETAILED DESCRIPTION OF THE PREFERRED EMBODIMENT OF THE INVENTION

Figure 1:
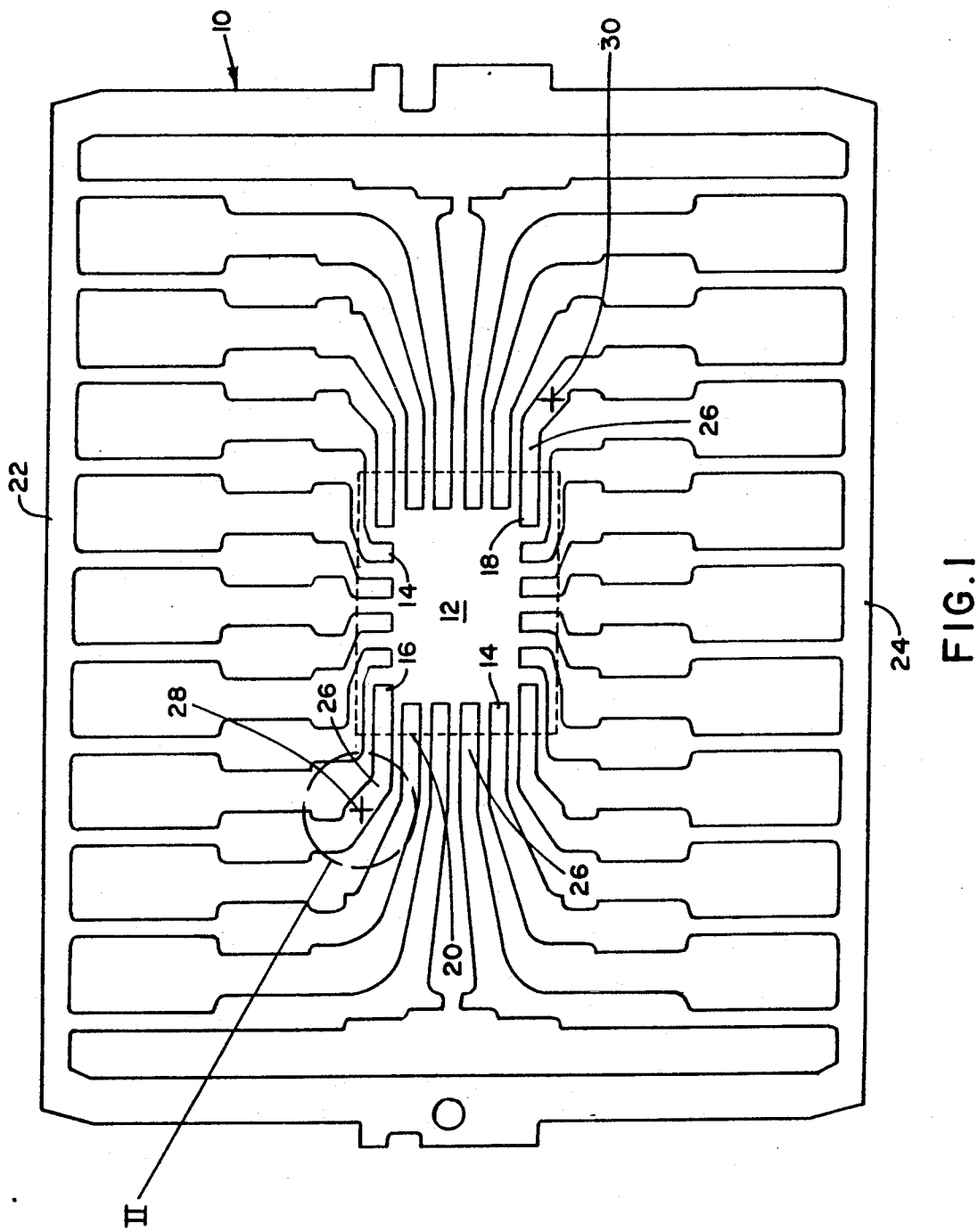
FIG. 1 is a plane view of the outside surface of the lead side of a lead frame incorporating the locating eye point markings according to the present invention.

With reference to FIG. 1, one form of an individual lead frame 10 is illustrated. Lead frames may take different shapes and may take the form of strips instead of individual frames, all of which may utilize the advantages of the present invention. The frame 10 has a die pad opening 12 to which a die will be inserted, not shown, of the integrated circuit.

The particular frame illustrated has twenty leads 14, the leads 16 and 18 designated being diametrically oppositely arranged leads with reference to the central axes of the die pad opening 12. Leads similar to leads 16 and 18 are presently employed in present day wire bonding operations to determine the positions of all of the lead ends in the manner noted above. The frame itself being a well known element of integrated circuit packages will not be described in detail. It is necessary, however, to point out certain characteristics of the leads themselves and particularly the leads 16 and 18. The frame being transferred to the wire bonding step of the packaging operation has a coined area 20 which is caused by the stamping operations when the frame is formed. This area 20 extends backwardly from the inner "open" ends of the leads towards the two opposite side members 22 and 24 of the frame.

The dash line 26 serves to indicate the outer boundary of the coined area 20. Outward of the coined area 20 of the leads 16 and 18, the leads continue to take the form of flat outer support surfaces 26 where the leads extend until they pass over the "top" and continue "down" the two sides 22 and 24.

Figure 2:
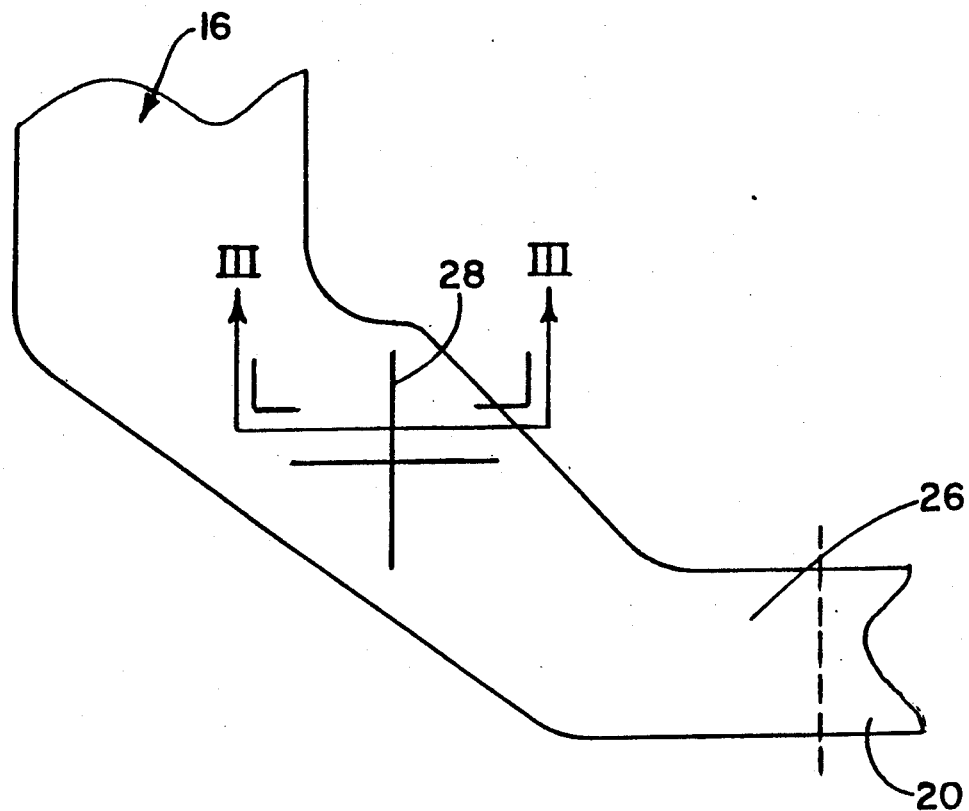
FIG. 2 is a view of an enlarged portion of FIG. 1 showing one of the eye point markings.
Figure 3:
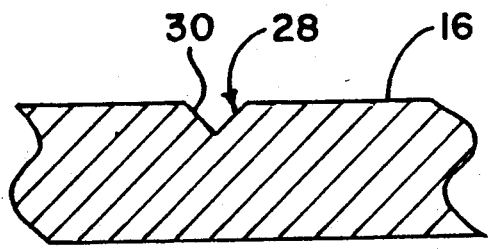
FIG. 3 is sectional view taken on line III—III of FIG. 2.

In FIG. 1, with respect to the leads 1 6 and 18, there is shown two identical eye point location markings 28 and 30 which are arranged outside the coined area 20 and o the support surfaces 26 In this way the markings are not formed in the coined aluminum portions of the leads but on the harder Ni-Iron alloy portions to give a clearer imprint. The marks, in the example of FIG. 1, are 0.020 inch in from the edge of the beginning of the coined area. FIG. 2 better illustrates the eye point markings 28 of lead 16, which takes the form of a "+" having substantial equal length legs where the legs are generally perpendicular to each other and generally centrally arranged relative to each other. The points or markings are formed by physical indentations on the surface 26 by, for example, a stamping tool which can be done as part of one of the stamping operations used in forming the frame. As shown, the eye point marking 28 takes up most of the available area of the support surface 26. FIG. 3 shows the shape of the deformation in the surface 26 in the form of an approximate 90° "V" 30, the width of the surface 26 being 0.036 inch, the "V" 30 having a depth, for example of approximately 0.0003–0.0005 inch.

While the eye points are shown to be indentations they may take other physical forms such as projections from the surface 26. Also the shape, including the cross section shape of the eye point markings may be varied, for example such as two spaced apart parallel lines and a "U" shaped grove. What is important is that what ever shape and size is used it be of such a physical character to allow electromagnetic device detection by available optical cameras, not shown.

In employing the locating eye points according to the present invention, the optical cameras now used in the semiconductor industry will now be able to quickly and accurately locate the leads 16 and 18 and from which in the usual manner use the locating information to automatically determine the exact locations of the ends of all of the leads 14 to allow the computer driven bonding machine to properly move the frame relative to the welding elements of the machine s that the bonding operation can be successfully completed.

While the invention has been described in the preferred embodiment, it will be appreciated by those skilled in the art that the invention may take other forms and be used for other types of lead frames than what is herein described without departing from the invention.

We claim:

1. A lead frame having a number of lead terminals arranged around the parameter of a generally centrally located die area formed in the frame,
   said lead terminals each having an end adjacent said die area and each having outside surfaces,
   said adjacent ends constituting a coined area,
   said lead terminals having portions extending away from said coined area,
   said extending portions having support sections,
   a pair of lead terminals having a diametrically opposed angular relationship relative to each other with respect to a central axis of said die area,
   said pair of lead terminals having marking indentations on said extended portions on said outside surfaces of a character sufficient to allow electromagnetic wave detection of said marking indentations,
   said marking indentations located on their respective lead terminals outside said coined area and between said coined area and said support sections, and
   said coined area being formed of an aluminum alloy and the areas of said extended portions containing said marking indentations being formed of a nickel-iron.

* * * * *